(12) United States Patent
Fukuzumi

(10) Patent No.: US 6,980,464 B2
(45) Date of Patent: Dec. 27, 2005

(54) MAGNETIC RANDOM ACCESS MEMORY

(75) Inventor: Yoshiaki Fukuzumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/310,022

(22) Filed: Dec. 5, 2002

(65) Prior Publication Data

US 2004/0047177 A1 Mar. 11, 2004

(30) Foreign Application Priority Data

Sep. 10, 2002 (JP) .................................. 2002-264215

(51) Int. Cl.$^7$ ............................................. G11C 11/00
(52) U.S. Cl. ..................... 365/158; 365/171; 365/173
(58) Field of Search ............................... 365/157, 171, 365/173

(56) References Cited

U.S. PATENT DOCUMENTS

| | | | |
|---|---|---|---|
| 3,483,534 A | | 12/1969 | Castellani et al. |
| 5,579,943 A | | 12/1996 | Torok et al. |
| 6,134,138 A | | 10/2000 | Lu et al. |
| 6,215,695 B1 | | 4/2001 | Ikeda |
| 6,404,674 B1 | * | 6/2002 | Anthony et al. ............ 365/173 |
| 6,587,371 B1 | * | 7/2003 | Hidaka ....................... 365/173 |
| 6,606,262 B2 | * | 8/2003 | Perner ........................ 365/158 |
| 6,646,910 B2 | * | 11/2003 | Bloomquist et al. ........ 365/158 |
| 6,795,281 B2 | * | 9/2004 | Tran et al. .................. 365/158 |
| 2003/0174537 A1 | * | 9/2003 | Bloomquist et al. ........ 365/171 |

FOREIGN PATENT DOCUMENTS

| | | |
|---|---|---|
| EP | 0 875 901 A2 | 11/1998 |
| EP | 1 061 592 A2 | 12/2000 |
| EP | 1 248 273 A2 | 10/2002 |
| EP | 1 296 331 A2 | 3/2003 |
| EP | 1 296 332 A2 | 3/2003 |
| EP | 1 298 669 A2 | 4/2003 |
| EP | 1 321 943 A2 | 8/2003 |
| EP | 1 345 231 A1 | 9/2003 |
| EP | 1 383 133 A1 | 1/2004 |
| EP | 1 398 788 A2 | 3/2004 |
| JP | 09-091949 * | 4/1997 |
| JP | 2001 195878 A | 7/2001 |
| JP | 2001-237472 * | 8/2001 |
| WO | WO 00 10178 A | 2/2000 |
| WO | WO 03 034436 A2 | 4/2003 |
| WO | WO 03 054886 A2 | 7/2003 |
| WO | WO 2004 012197 A2 | 2/2004 |

OTHER PUBLICATIONS

Roy Scheuerlein, et al., "A 10ns Read and Write Non–Volatile Memory Array Using a Magnetic Tunnel Junction and FET Switch in Each Cell", IEEE International Solid–State Circuits Conference, pp. 128–129.

(Continued)

Primary Examiner—Huan Hoang
(74) Attorney, Agent, or Firm—Oblon, Spivak, McClelland, Maier & Neustadt, P.C.

(57) ABSTRACT

An MRAM includes a magneto resistive element, which has a record layer and a reference layer disposed to sandwich a tunnel barrier film and is configured to store data in the record layer. An electric current drive line is disposed to selectively apply a magnetic field to the magneto resistive element. The record layer has a first ferromagnetic layer while the reference layer has a second ferromagnetic layer. Retentivity of retaining a magnetization direction of the second ferromagnetic layer is smaller than retentivity of retaining a magnetization direction of the first ferromagnetic layer, against a magnetic field applied to the magneto resistive element by the electric current drive line.

31 Claims, 4 Drawing Sheets

OTHER PUBLICATIONS

Masashige Sato, et al., "Spin–Valve–Like Properties of Ferromagnetic Tunnel Junctions", Jpn. J. Appl. Phys., vol. 36, Part 2, No. 2B, Feb. 15, 1997, pp. L200–L201.

Koichiro Inomata et al. "Spin–Dependent Tunneling Between a Soft Ferromagnetic Layer and Hard Magnetic Nanosize Particles", Jpn. J. Appl. Phys., vol. 36, Part 2, No. 10B, Oct. 15, 1997, pp. L1380–L1383.

Daughton J. M. "Magnetic Tunneling Applied to Memory (Invited)", Journal of Applied Physics, American Institute of Physics, New York, USA, vol. 81, No. 8, Part 2A, Apr. 15, 1997, pp. 3758–3763, XP000702683.

Tehrani S. et al. "High Density Nonvolatile Magnetoresistive Ram", Electron Devices Meeting, 1996, International San Francisco, CA, USA 8–11 Dec. 1996, New York, NY, USA, IEEE, US, pages 193–196, XP010207566.

* cited by examiner

MAGNETIC RANDOM ACCESS MEMORY

CROSS-REFERENCE TO RELATED APPLICATIONS

This application is based upon and claims the benefit of priority from the prior Japanese Patent Application No. 2002-264215, Sept. 10, 2002, the entire contents of which are incorporated herein by reference.

BACKGROUND OF THE INVENTION

1. Field of the Invention

The present invention relates to a magnetic random access memory having memory cells, each using a magneto resistive element that stores data by means of a magneto resistive effect.

2. Description of the Related Art

"Magnetic random access memory" (which will be referred to as MRAM) is a generic name of solid memories that can rewrite, hold, and read record information, as the need arises, by utilizing the magnetization direction of a ferromagnetic body used as an information recording carrier.

In general, each of the memory cells of the MRAM has a structure in which a plurality of ferromagnetic bodies are stacked one on the other. Information recording is performed by assigning units of binary information "1" and "0" respectively to parallel and anti-parallel states, i.e., the relative positions in magnetization, of the plurality of ferromagnetic bodies forming each memory cell. When record information is written, the magnetization direction of a ferromagnetic body of each cell is inverted by a magnetic field generated by electric currents fed through write lines, which are disposed in a criss-cross fashion. The MRAM is a nonvolatile memory, which, in principle, has zero power consumption during record holding, and record holding is maintained even after power off. Record information is read by utilizing the so-called magneto resistive effect, in which the electric resistance of each memory cell varies in accordance with the angle between the magnetization direction of a ferromagnetic body in each memory cell and the sense current, or angle between the magnetization directions of a plurality of ferromagnetic layers.

The MRAM has many advantages in function, as shown in the following (1) to (3), as compared to conventional semiconductor memories using a dielectric body. (1) It is completely nonvolatile, and allows the number of rewriting operations to be more than $10^{15}$. (2) It allows nondestructive reading, and requires no refreshing operation, thereby shortening read cycles. (3) As compared to memory cells of the charge accumulation type, it has a high radiation-tolerance. The MRAM may have an integration degree per unit area, and write and read times, almost the same as those of the DRAM. Accordingly, it is expected that the DRAM will be applied to external recording devices for portable equipment, hybrid LSIs, and primary storage for personal computers, making the most of the specific feature of nonvolatility.

At present, feasibility studies are being carried out regarding practical use of MRAMs, in which each memory cell employs, as a magneto resistive element, an MTJ (Magnetic Tunnel Junction) element that forms a ferromagnetic tunnel junction (for example, ISSCC 2000 Digest Paper TA7.2). The MTJ element is formed mainly of a three-layered film, i.e., ferromagnetic layer/insulating layer/ferromagnetic layer, in which an electric current flows by tunneling through the insulating layer. The electric resistance value of the junction varies in proportion to the cosine of the relative angles in magnetization of the two ferromagnetic metal layers. The resistance value becomes maximum when the magnetization directions are in anti-parallel with each other. This is called a TMR (tunneling magneto resistive) effect. For example, in the case of $NiFe/Co/Al_2O_3/Co/NiFe$, a magneto resistive change rate of more than 25% is observed with a low magnetic field of 50 Oe or less.

As a structure of the MTJ element, there is known a retentivity difference type, which utilizes the difference in retentivity between two ferromagnetic bodies to hold data. There is also known a so-called spin valve structure type, in which an anti-ferromagnetic body is disposed adjacent to one of two ferromagnetic bodies to fix its magnetization direction, so as to improve the magnetic field sensitivity or to reduce the electric current in writing (for example, Jpn. J. Appl. Phys., 36, L200 (1997)).

However, in order to develop MRAMs having an integration degree of Class-Gb, there are several problems left to solve. One of them is that a variation in junction resistance due to the variation in processing MTJ elements is not negligible as compared to the TMR effect, and makes reading very difficult. A reading operation of the self-reference type can be used to solve this problem, and an example of this is explained below.

First, a value of an electrical-property based on stored data in a selected memory cell at a read target address is detected and stored in a data buffer. Then, "1" data is written in the selected memory cell and read therefrom, so that a value of the electrical property based on the "1" data is detected and stored in a "1" data buffer. Then, "0" data is written in the selected memory cell and read therefrom, so that a value of the electrical property based on the "0" data is detected and stored in a "1" data buffer. Lastly, the value of the electrical property based on the stored data is compared with the values of the electrical property based on the "1" data and the "0" data, to determine the value of the stored data.

As described above, the reading operation of the self-reference type is basically destructive reading. As a consequence, where the stored data is "1", for example, it is necessary to rewrite "1" data after determining the value of the stored data. In addition, it requires complicated steps to complete reading, which reduces the reading operation speed and hinders realization of a high speed memory. Furthermore, it is accompanied by two writing actions, which increase the power consumption in reading.

Accordingly, it is preferable to provide an MRAM, which can perform reading with a small number of errors, by a reduced number of steps as compared to the reading operation of the self-reference type, and by nondestructive reading.

BRIEF SUMMARY OF THE INVENTION

According to a first aspect of the present invention, there is provide a magnetic random access memory comprising:

a memory cell array including memory cells respectively disposed at addresses arranged in a matrix format, each of the memory cells including a magneto resistive element as a storing element, which has a record layer and a reference layer disposed to sandwich a tunnel barrier film and is configured to store data in the record layer;

word lines respectively connected to rows of the memory cell array;

bit lines respectively connected to columns of the memory cell array;

a row decoder configured to select the word lines; and a column decoder configured to select the bit lines, wherein, when stored data in a record layer in a selected memory cell in the memory cell array is read, a value of the stored data is determined by performing a reading action while applying a magnetic field for reading to the magneto resistive element by at least one of the word line and the bit line, the magnetic field for reading being capable of changing a magnetization direction of the reference layer of the selected memory cell without destroying the stored data.

In the first aspect, the memory may be arranged such that, when the stored data is read, a value of the stored data is determined by performing a reading action while not applying the magnetic field for reading, to detect a primitive value of an electrical property of the selected memory cell; performing a reading action while applying the magnetic field for reading, to detect a reference value of an electrical property of the selected memory cell; and comparing the primitive value and the reference value with each other.

According to a second aspect of the present invention, there is provide a magnetic random access memory comprising:

a magneto resistive element, which has a record layer and a reference layer disposed to sandwich a tunnel barrier film and is configured to store data in the record layer; and an electric current drive line configured to selectively apply a magnetic field to the magneto resistive element, wherein the record layer comprises a first ferromagnetic layer while the reference layer comprises a second ferromagnetic layer, and retentivity of retaining a magnetization direction of the second ferromagnetic layer is smaller than retentivity of retaining a magnetization direction of the first ferromagnetic layer, against a magnetic field applied to the magneto resistive element by the electric current drive line.

In the second aspect, the reference layer may be arranged such that the magnetization direction of the second ferromagnetic layer is oriented toward a specific direction, without depending on the magnetization direction of the first ferromagnetic layer, when no electric current is fed to the electric current drive line.

In the second aspect, the reference layer may be arranged such that the magnetization direction of the second ferromagnetic layer is determined, depending on the magnetization direction of the first ferromagnetic layer, when no electric current is fed to the electric current drive line.

DETAILED DESCRIPTION OF THE INVENTION

Figure 1:
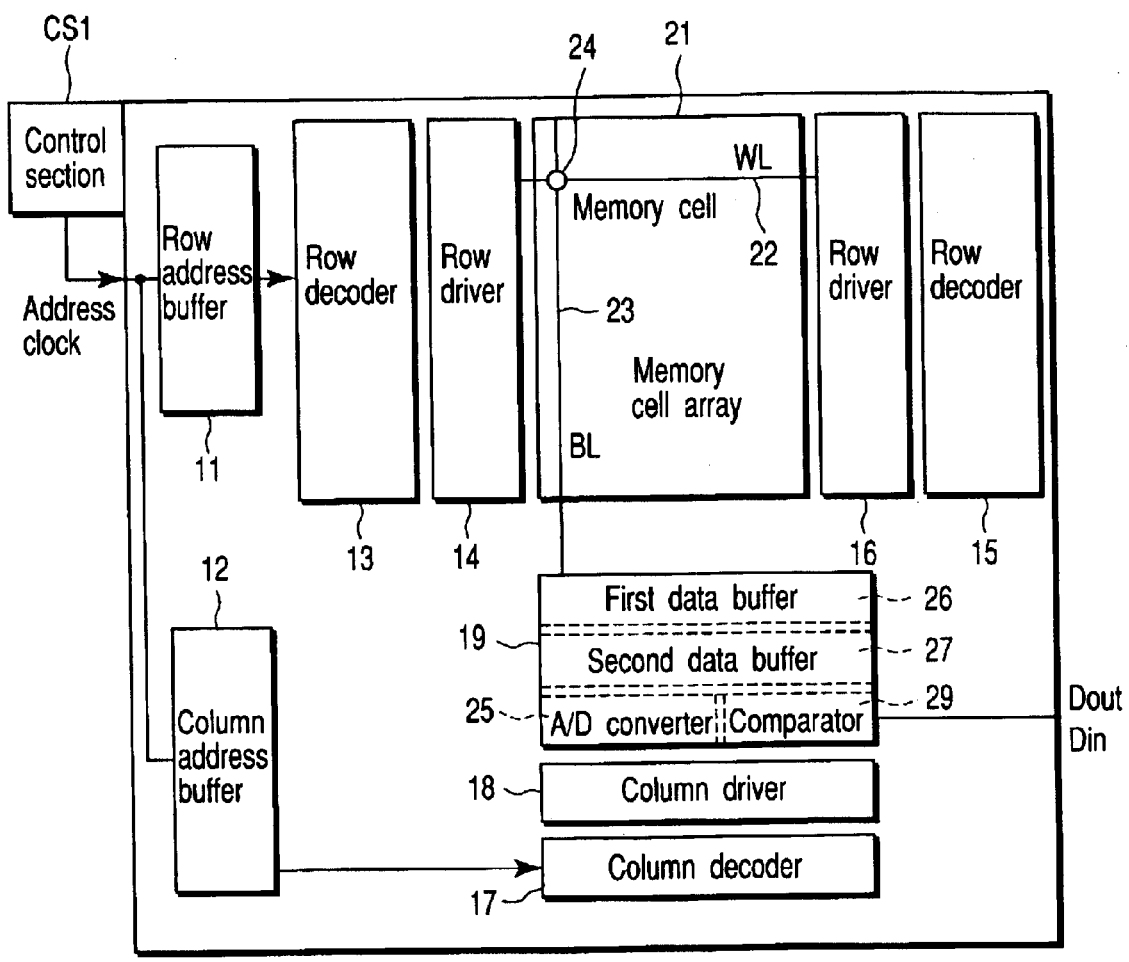
FIG. 1 is a block diagram showing an MRAM according to a first embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

First Embodiment

FIG. 1 is a block diagram showing an MRAM according to a first embodiment of the present invention. This MRAM has a memory chip configuration of the synchronism type.

The MRAM has a memory cell array 21 formed of memory cells 24 respectively disposed at addresses arranged in a matrix format. Each of the memory cells 24 includes a magneto resistive element (MTJ element) as a storing element. Word lines 22 are respectively connected to the rows of the memory cell array 21, and bit lines 23 are respectively connected to the columns of the memory cell array 21. In FIG. 1, the word lines 22 are shown to represent both of write word lines and read word lines, for the sake of simplicity.

A row address buffer 11, row decoders 13 and 15, and row drivers 14 and 16 are disposed to select the word lines 22. A column address buffer 12, column decoder 17, and column driver 18 are disposed to select the bit lines 23. A sensing circuit 19 is connected to the bit lines 23, for reading stored data in a manner described later. The sensing circuit 19 includes an A/D converter 25, first data buffer 26, second data buffer 27, comparator 29, and so forth.

The row address buffer 11 and column address buffer 12 are connected to a control section CS1 for generating address signals, data signals, and so forth. The control section CS1 is disposed on a substrate common to the memory cell array 21, or is formed as a device separate from the memory cell array 21. Address signals from the control section CS1 are temporarily latched in the row address buffer 11 and column address buffer 12.

In reading, a row and column are respectively selected by the row decoder 13 and column decoder 17, on the basis of latched address signals. In writing, a bit line 23 with an address corresponding to an selected memory cell 24 is fed with electric current, and, at the same time, a word line 22 with an address corresponding to an selected memory cell 24 is fed with an electric current from each of the right and left row drivers 16 and 14 in accordance with information to be written.

In the MRAM according to this embodiment, the following steps are performed to read stored data in a selected memory cell in the cell array. This reading operation is possible due to an improved structure of each memory cell 24 including an MTJ element, as described later.

First, reading is performed on a selected memory cell without a magnetic field being applied to its MTJ element. By doing so, a primitive value of an electrical property (typically resistance) of the selected memory cell is detected, and data of the primitive value is stored in the first data buffer 26. Then, reading is performed on the selected memory cell while applying a magnetic field for reading to its MTJ element by at least one of the corresponding word line 22 and bit line 23, which function as electric current drive lines for generating a magnetic field. By doing so, a reference value of the electrical property of the selected memory cell is detected, and data of the reference value is stored in the second data buffer 27. Then, the primitive value and reference value stored in the first and second data buffers 26 and 27 are compared with each other by the comparator 29 to determine whether the value of the stored data is, e.g., "1" or "0".

Figure 2:
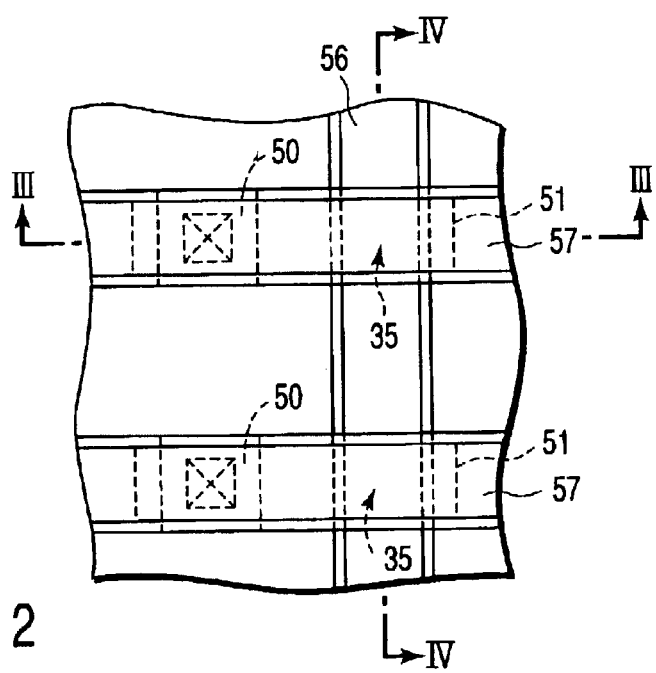
FIG. 2 is a plan view showing a part corresponding to two memory cells of the MRAM according to the first embodiment of the present invention.
Figure 3:
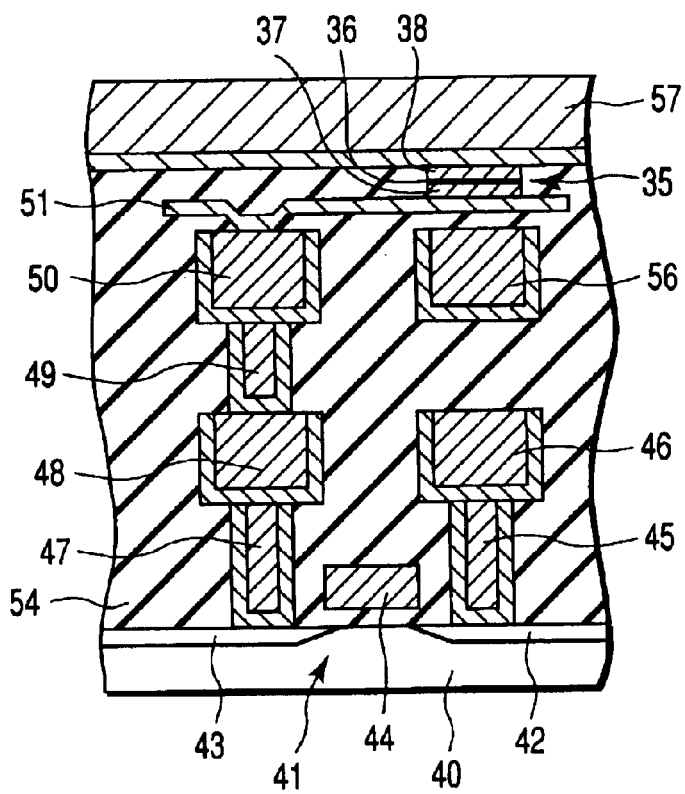
FIG. 3 is a sectional view cut along a line III—III in FIG. 2.
Figure 4:
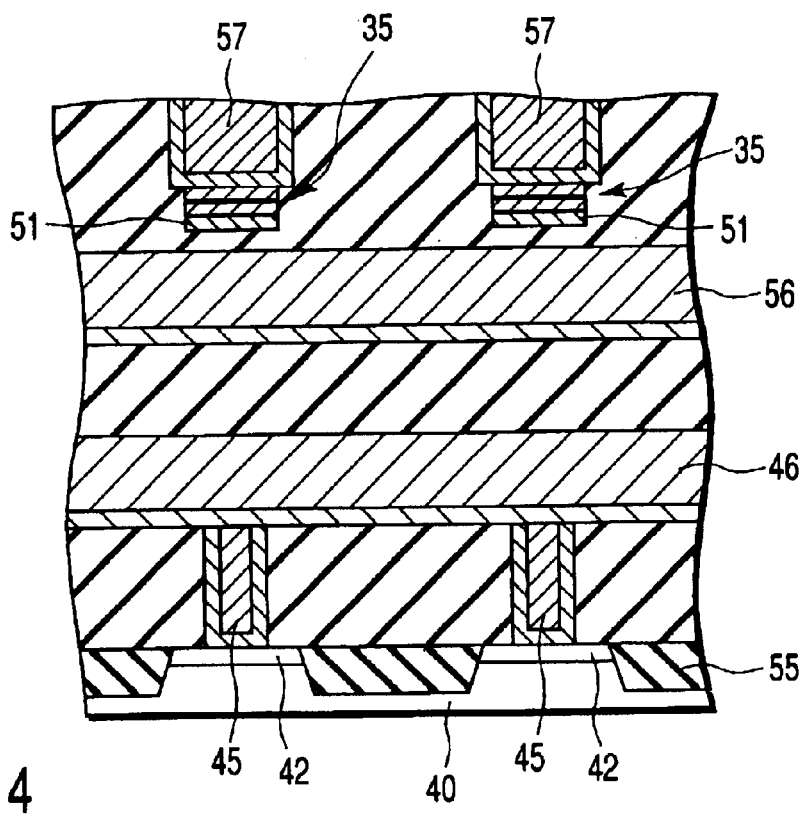
FIG. 4 is a sectional view cut along a line IV—IV in FIG. 2.

FIG. 2 is a plan view showing a part corresponding to two memory cells of the MRAM according to the first embodiment of the present invention. FIGS. 3 and 4 are sectional views cut along a line III—III and line IV—IV, respectively, in FIG. 2.

On a semiconductor substrate 40, an MOS transistor 41 is formed, and used as a switching element for reading. The MOS transistor 41 has a source diffusion layer 42 and drain diffusion layer 43 formed in the surface of the substrate 40, a gate electrode 44 disposed on a channel region in the surface of the substrate 40 with a gate insulating film interposed therebetween. The gate electrode 44 is formed of a part of a read word line (represented by a word line 22 in FIG. 1), which extends perpendicular to the sheet plane of FIG. 3. The source diffusion layer 42 is connected to a read source line 46 via a plug 45.

On the other hand, the drain diffusion layer 43 of the MOS transistor 41 is connected to an MTJ element 35 via plugs 47 and 49, and interconnection layers 48, 50, and 51. The MTJ element 35 is disposed between the interconnection layer 51 and a bit line 57 (represented by a bit line 23 in FIG. 1), which is one of electric current drive lines for writing. Directly below the MTJ element 35, a write word line 56 (represented by a word line 22 in FIG. 1), which is the other of the electric current drive lines for writing, is disposed with an insulating film interposed therebetween. The write word line 56 extends in a direction (row direction) perpendicular to a direction (column direction) in which the bit line 57 extends. In FIGS. 3 and 4, reference symbols 54 and 55 denote an interlayer insulating film and device isolation insulating film, respectively.

The write word line 56 and bit line 57 extend perpendicular to each other, as shown in FIG. 2, to form a cross-matrix. One MTJ element 35 disposed at the intersection of each write word line 56 and each bit line 57 corresponds to one memory cell 24 shown in FIG. 1. Data is written in the MTJ element 35 by a magnetic field formed by an electric current flowing through the write word line 56 and an electric current flowing through the bit line 57. In FIG. 3, the bit line 57 is disposed above the write word line 56, but a reversed structure may be adopted.

Each MTJ element 35 has a record layer 37 and reference layer 38 disposed to sandwich a tunnel barrier film 36, wherein data is stored in the record layer 37. Each of the record layer 37 and reference layer 38 has a ferromagnetic layer consisting of a single-layered or multi-layered film in which at least one layer is made of a ferromagnetic alloy containing Fe, Ni, and Co. The MTJ element 35 is designed such that retentivity of retaining the magnetization direction of the ferromagnetic layer of the reference layer 38 is smaller than retentivity of retaining the magnetization direction of the ferromagnetic layer of the record layer 37, against a magnetic field applied to the MTJ element 35 by, e.g., the write word line (electric current drive line) 56. In this respect, "retentivity of retaining a magnetization direction" means the minimum magnetic field necessary for inverting the magnetization direction. In place of "retentivity", "coercivity" can be used, as the case may be.

In other words, the minimum electric current value in absolute value of an electric current fed to the write word line 56, necessary for inverting the magnetization direction of the ferromagnetic layer of the reference layer 38, is smaller than the minimum electric current value in absolute value of an electric current fed to the write word line 56, necessary for inverting the magnetization direction of the ferromagnetic layer of the record layer 37. Accordingly, it is possible to apply such a magnetic field to the MTJ element 35 by feeding an electric current with a predetermined value to the write word line 56, that can change the magnetization direction of the ferromagnetic layer of the reference layer 38 without changing the magnetization direction of the ferromagnetic layer of the record layer 37.

With this arrangement, the following steps are performed to read stored data in the record layer 37 of the MTJ element 35. Specifically, first, reading is performed while no electric current is fed to the write word line 56 (without a magnetic field being applied to the MTJ element 35). By doing so, a primitive value of an electrical property (typically resistance) of the MTJ element 35 is detected. Then, reading is performed while an electric current with a predetermined value is fed to the write word line 56, as described above, so that such a magnetic field for reading is applied to the MTJ element 35, that causes only the magnetization direction of the ferromagnetic layer of the reference layer 38 to be changed, or to be oriented toward a specific direction. By doing so, a reference value of the electrical property of the MTJ element 35 is detected. Then, the primitive value and reference value are compared with each other to determine whether the value of the stored data is, e.g., "1" or "0".

In the operation described above of reading stored data in the MTJ element 35, the electric current value necessary for forming a magnetic field for reading, and the manner of determining the value of the stored data differ, depending on the structure of the memory cell 24 including the MTJ element. Detailed explanations will be sequentially given thereof, with reference to the following embodiments.

Second Embodiment

Figure 5:
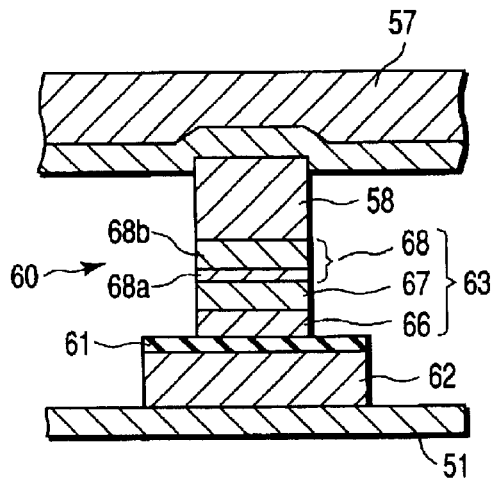
FIG. 5 is a sectional side view showing the MTJ element of each memory cell of an MRAM according to a second embodiment of the present invention.
Figure 6A:
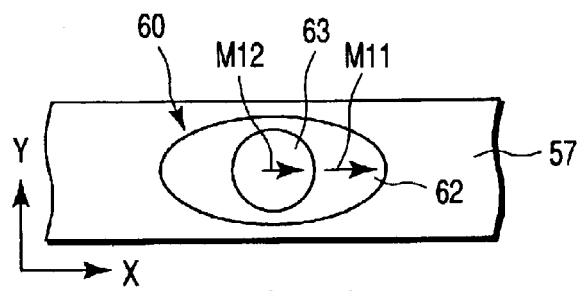
FIG. 6A is a layout plan view showing the MTJ element shown in FIG. 5.

FIGS. 5 and 6A are a sectional side view and layout plan view, respectively, showing the MTJ element of each memory cell of an MRAM according to a second embodiment of the present invention. The block diagram showing the entire structure of the MRAM according to this embodiment is substantially the same as that shown in FIG. 1. Also, this MRAM includes an interconnection structure and layer structure around each memory cell, substantially the same as those shown in FIGS. 2 to 4.

As shown in FIG. 5, an MTJ element 60 is sandwiched between an interconnection layer 51 and a bit line 57, i.e., it is disposed at the same position as the MTJ element 35 shown in FIG. 3. The MTJ element 60 has a spin valve structure including a record layer 62 and reference layer 63 disposed to sandwich a tunnel barrier film (insulating film) 61. The record layer 62 is formed of a ferromagnetic layer consisting of a single-layered or multi-layered film in which at least one layer is made of a ferromagnetic alloy containing Fe, Ni, and Co. The bottom of the record layer 62 is electrically connected to the interconnection layer 51.

On the other hand, the reference layer 63 is formed of a ferromagnetic layer 66 consisting of a single-layered or multi-layered film in which at least one layer is made of a ferromagnetic alloy containing Fe, Ni, and Co; a non-magnetic layer 67 consisting of a non-magnetic metal, such as Ru; and a high coercivity layer 68, in this order from the tunnel barrier film 61 side. The high coercivity layer 68 includes a ferromagnetic layer 68a consisting of a single-layered or multi-layered film in which at least one layer is made of a ferromagnetic alloy containing Fe, Ni, and Co; and an anti-ferromagnetic layer 68b consisting of at least one thin film which is made of an anti-ferromagnetic body, such as PtMn. The top of the anti-ferromagnetic layer 68b is electrically connected to the bit line 57 via an interconnection 58.

The MTJ element 60 may be formed of an MTJ element having a dual spin valve structure. In this case, the MTJ element 60 has two tunnel barrier films disposed to sandwich a record layer, and two reference layers disposed one on either outside of the two tunnel barrier films. The structures of the record layer and each of the reference layers may be the same as those shown in FIG. 5, for example. Where the dual spin valve structure is adopted, it is possible to reduce a decrease in magneto resistive change rate relative to the applied voltage, and to increase the breakdown voltage.

The MTJ element 60 is designed such that retentivity of retaining the magnetization direction of the ferromagnetic layer 66 of the reference layer 63 is smaller than retentivity of retaining the magnetization direction of the ferromagnetic layer of the record layer 62, against a magnetic field applied to the MTJ element 60 by the write word line (electric current drive line) 56 (see FIG. 3). Accordingly, it is possible to apply such a magnetic field to the MTJ element 60 by feeding an electric current with a predetermined value to the write word line 56, that can change the magnetization direction of the ferromagnetic layer 66 of the reference layer 63 without changing the magnetization direction of the ferromagnetic layer of the record layer 62.

This design in retentivity of the magnetization directions can be realized by weakening the coupling between the high coercivity layer 68 and ferromagnetic layer 66 in the reference layer 63. In the structure shown in FIG. 5, the non-magnetic layer 67 sandwiched between the high coercivity layer 68 and ferromagnetic layer 66 is used to weaken the coupling between the two layers. Another condition change may be suitably adopted to weaken the coupling between the high coercivity layer 68 and ferromagnetic layer 66, such as reducing the thickness of the high coercivity layer 68, reducing the thickness of the ferromagnetic layer 66 itself, or increasing the thickness of the non-magnetic layer 67. In order to prevent the magnetization direction of the record layer (ferromagnetic layer) 62 from being inverted, it is preferable that the retentivity of the magnetization direction of the record layer 62 is two times or more larger than that of the ferromagnetic layer 66 of the reference layer 63, against a magnetic field oriented in the easy magnetization axis direction of the record layer 62.

As shown in FIG. 6A, where the bit line 57 extends in an X direction, and the write word line 56 (see FIG. 3) extends in a Y direction, the long axis direction and easy magnetization axis direction of the record layer 62 are in parallel with the X direction. On the other hand, the easy magnetization axis direction of the ferromagnetic layer 66 of the reference layer 63 and the magnetization direction of the anti-ferromagnetic layer 68b are also in parallel with the X direction, and thus they are perpendicular to the extending direction of the write word line 56 (Y direction), which is used for applying a magnetic field for reading.

According to this embodiment, the following steps are performed to read stored data in the record layer 62. In the explanation of a reading operation give below, it is assumed that, where the stored data is "1", the magnetization directions of the ferromagnetic layer of the record layer 62 and the ferromagnetic layer 66 of the reference layer 63 are respectively in conditions as shown with arrows M11 and M12 in FIG. 6A, in the initial state. It is also assumed that, when an electric current Iref1 for reading is fed to the write word line 56, such a magnetic field is applied to the MTJ element 60, that inverts (rotates by about 180°) the magnetization direction of the ferromagnetic layer 66 of the reference layer 63 without changing the magnetization direction of the ferromagnetic layer of the record layer 62.

Performing reading without feeding an electric current to the write word line (to obtain a primitive value);

performing reading while feeding Iref1 to the write word line (to obtain a reference value);

comparing the primitive value and reference value with each other to determine the value of the stored data;

if the primitive value<the reference value, the stored data is "1"; and if the primitive value>the reference value, the stored data is "0".

Specifically, where the spin (magnetization direction) of the record layer 62 and the spin (magnetization direction) of the reference layer 63 are in parallel with each other in the initial state, feeding the electric current Iref1 for reading causes the spins to be in anti-parallel with each other, thereby increasing the tunneling magneto resistive value. On the other hand, where the spin of the record layer 62 and the spin of the reference layer 63 are in anti-parallel with each other in the initial state, feeding the electric current Iref1 for reading causes the spins to be in parallel with each other, thereby reducing the tunneling magneto resistive value. Accordingly, it is possible to determine whether the value of the stored data is "1" or "0", by observing the large-and-small relationship between the primitive value and reference value.

According to this embodiment, it is possible to invert only the spin (magnetization direction) of the reference layer 63 without inverting the spin (magnetization direction) of the ferromagnetic layer of the record layer 62, so as to perform nondestructive reading. The orientation of the spin of the reference layer 63 comes back to its original state due to the coupling between the high coercivity layer 68 and ferromagnetic layer 66, when the electric current fed to the write word line 56 is returned to zero. In this operation, a reading step for obtaining a reference value is performed while feeding an electric current to the write word line 56, thereby reducing the number of operation steps in the conventional self-reference method.

In order to improve the data holding property, the record layer 62 preferably has a geometric anisotropy such that the ratio of the length in the easy magnetization axis direction relative to the length in the hard magnetization axis direction remarkably deviates from 1. In this embodiment, the record layer 62 is designed such that the ratio of the length in the easy magnetization axis direction relative to the length in the hard magnetization axis direction (X direction length/Y direction length) is 1.5 or more.

On the other hand, the reference layer 63 is preferably designed such that the ratio of the length in the easy magnetization axis direction relative to the length in the hard magnetization axis direction (X direction length/Y direction length) is near 1 or less than 1. With this arrangement, the magnetization direction of the ferromagnetic layer 66 of the reference layer 63 can be easily inverted by a magnetic field for reading from the write word line 56. In other words, the electric current value for forming a magnetic field for reading can be reduced. As a consequence, it is possible to reduce the power consumption in reading, and to suppress the influence on the record layers 62 of the adjacent memory cells in reading, thereby increasing the reliability of the MRAM.

Figure 6B:
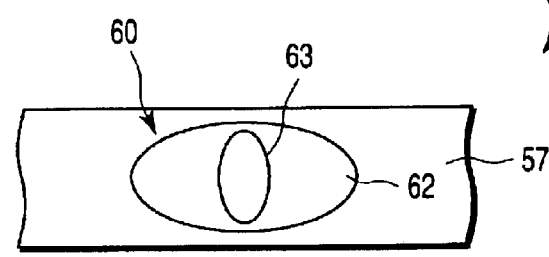
FIG. 6B is a layout plan view showing its modification.

From this viewpoint, in the structure shown in FIG. 6A, the record layer 62 has an elliptic shape having a ratio of 2, which is defined by the long axis length (length in the easy magnetization axis direction)/the short axis length (length in the hard magnetization axis direction), while the reference layer 63 has a circular shape. In a modified structure shown in FIG. 6B, each of a record layer 62 and reference layer 63 has an elliptic shape, and the long axis direction (easy magnetization axis direction) of the record layer 62 and the long axis direction (hard magnetization axis direction) of the reference layer 63 are perpendicular to each other.

According to this embodiment, a difference in read signal quantity almost the same as that by the conventional self-reference method can be realized by nondestructive reading. Accordingly, it is possible to prevent a decrease in reliability due to individual differences between memory cells, which have been caused by processing. Furthermore, the number of operation steps is reduced as compared to the conventional self-reference method, thereby allowing a high speed operation.

Third Embodiment

Figure 7:
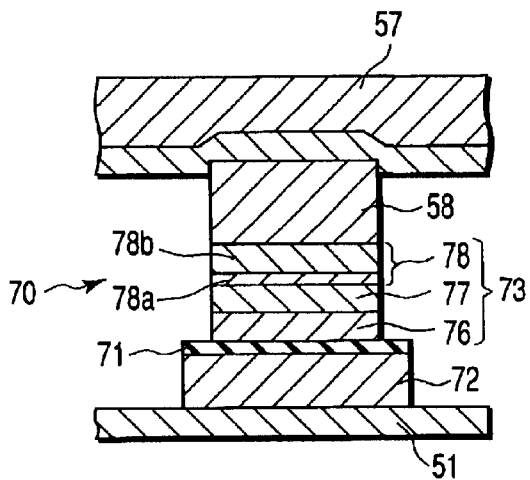
FIG. 7 is a sectional side view showing the MTJ element of each memory cell of an MRAM according to a third embodiment of the present invention.
Figure 8:
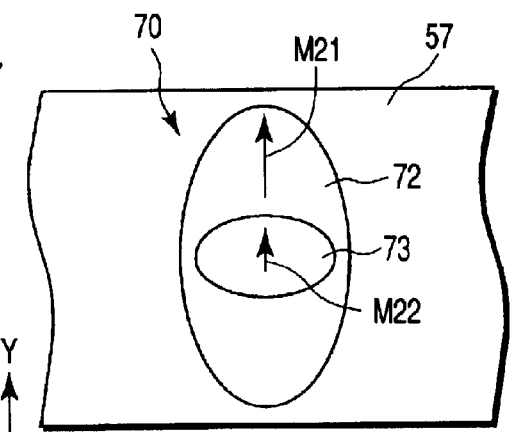
FIG. 8 is a layout plan view showing the MTJ element shown in FIG. 7.

FIGS. 7 and 8 are a sectional side view and layout plan view, respectively, showing the MTJ element of each memory cell of an MRAM according to a third embodiment of the present invention. The block diagram showing the entire structure of the MRAM according to this embodiment is substantially the same as that shown in FIG. 1. Also, this MRAM includes an interconnection structure and layer structure around each memory cell, substantially the same as those shown in FIGS. 2 to 4.

In the second embodiment described above, information of n-number bits belonging to one write word line 56 can be read together at a time from a number of bit lines extending in parallel, by one reading action. However, in terms of writing actions, a structure adopted in general is designed such that data units "1" and "0" are respectively written, relying on directions of the electric current fed to a bit line. In the case of the second embodiment in which the easy magnetization axis direction of the ferromagnetic layer of the record layer 62 is perpendicular to the extending direction of the write word line 56 (Y direction), it is necessary to perform n-number writing actions, in order to perform writing on all the n-number bits belonging to one write word line 56. In contrast, according to the third embodiment, it is possible to complete each of reading and writing on all the n-number bits belonging to one write word line 56, by one action.

As shown in FIG. 7, an MTJ element 70 is sandwiched between an interconnection layer 51 and a bit line 57, i.e., it is disposed at the same position as the MTJ element 35 shown in FIG. 3. The MTJ element 70 has a spin valve structure including a record layer 72 and reference layer 73 disposed to sandwich a tunnel barrier film (insulating film) 71. The record layer 72 is formed of a ferromagnetic layer consisting of a single-layered or multi-layered film in which at least one layer is made of a ferromagnetic alloy containing Fe, Ni, and Co. The bottom of the record layer 72 is electrically connected to the interconnection layer 51.

On the other hand, the reference layer 73 is formed of a ferromagnetic layer 76 consisting of a single-layered or multi-layered film in which at least one layer is made of a ferromagnetic alloy containing Fe, Ni, and Co; a non-magnetic layer 77 consisting of a non-magnetic metal, such as Ru; and a high coercivity layer 78, in this order from the tunnel barrier film 71 side. The high coercivity layer 78 includes a ferromagnetic layer 78a consisting of a single-layered or multi-layered film in which at least one layer is made of a ferromagnetic alloy containing Fe, Ni, and Co; and an anti-ferromagnetic layer 78b consisting of at least one thin film which is made of an anti-ferromagnetic body, such as PtMn. The top of the anti-ferromagnetic layer 78b is electrically connected to the bit line 57 via an interconnection 58.

The MTJ element 70 is designed such that retentivity of retaining the magnetization direction of the ferromagnetic layer 76 of the reference layer 73 is smaller than retentivity of retaining the magnetization direction of the ferromagnetic layer of the record layer 72, against a magnetic field applied to the MTJ element 70 by the write word line (electric current drive line) 56 (see FIG. 3). Accordingly, it is possible to apply such a magnetic field to the MTJ element 70 by feeding an electric current with a predetermined value to the write word line 56, that can change the magnetization direction of the ferromagnetic layer 76 of the reference layer 73 without changing the magnetization direction of the ferromagnetic layer of the record layer 72.

This design in retentivity of the magnetization directions can be realized by weakening the coupling between the high coercivity layer 78 and ferromagnetic layer 76 in the reference layer 73, as described in the second embodiment. Also, the MTJ element 70 may be formed of an MTJ element having a dual spin valve structure, as described in the second embodiment.

As shown in FIG. 8, where the bit line 57 extends in an X direction, and the write word line 56 (see FIG. 3) extends in a Y direction, the long axis direction and easy magnetization axis direction of the record layer 72 are in parallel with the Y direction. On the other hand, the long axis direction of the ferromagnetic layer 76 of the reference layer 73 is in parallel with the X direction, and thus it is perpendicular to the extending direction of the write word line 56 (Y direction), which is used for applying a magnetic field for reading. The axis of induction-magnetic anisotropy of the anti-ferromagnetic layer 78b of the reference layer 73 is in parallel with the Y direction, while the axis of induction-magnetic anisotropy of the ferromagnetic layer 76 of the reference layer 73 is in parallel with the X direction.

With this arrangement, when no external magnetic field is present, the magnetization direction of the ferromagnetic layer 76 of the reference layer 73 is oriented in the Y direction due to the coupling between itself and the high coercivity layer 78. On the other hand, when an external magnetic field in the X direction is present, the magnetization direction of the ferromagnetic layer 76 is easily oriented in the X direction due to its geometry-magnetic anisotropy and induction-magnetic anisotropy. Specifically, the orientation of the axis of induction-magnetic anisotropy almost agrees with the orientation of a magnetic field, which is applied to a magnetic film in a process of depositing the magnetic film, or in a process of annealing the magnetic film.

According to this embodiment, the following steps are performed to read stored data in the record layer 72. The operation principle at this time is basically the same as that of the second embodiment. However, when a magnetic field for reading is applied to the MTJ element 70 by the write word line 56, the magnetization direction of the ferromagnetic layer 76 of the reference layer 73 comes to be almost perpendicular to the magnetization direction of the ferromagnetic layer of the record layer 72.

In the explanation of a reading operation give below, it is assumed that, where the stored data is "1", the magnetization directions of the ferromagnetic layer of the record layer 72 and the ferromagnetic layer 76 of the reference layer 73 are respectively in conditions as shown with arrows M21 and M22 in FIG. 8, in the initial state. It is also assumed that, when an electric current Iref2 for reading is fed to the write word line 56, such a magnetic field is applied to the MTJ element 70, that changes (rotates by about 90°) the magnetization direction of the ferromagnetic layer 76 of the reference layer 73 without changing the magnetization direction of the ferromagnetic layer of the record layer 72.

Performing reading without feeding an electric current to the write word line (to obtain a primitive value);

performing reading while feeding Iref2 to the write word line (to obtain a reference value);

comparing the primitive value and reference value with each other to determine the value of the stored data;

if the primitive value<the reference value, the stored data is "1"; and if the primitive value>the reference value, the stored data is "0".

Specifically, where the spin (magnetization direction) of the record layer 72 and the spin (magnetization direction) of the reference layer 73 are in parallel with each other in the initial state, feeding the electric current Iref2 for reading causes the spins to be almost perpendicular to each other, thereby increasing the tunneling magneto resistive value. On the other hand, where the spin of the record layer 72 and the spin of the reference layer 73 are in anti-parallel with each other in the initial state, feeding the electric current Iref2 for reading causes the spins to be almost perpendicular to each other, thereby reducing the tunneling magneto resistive value. Accordingly, it is possible to determine whether the value of the stored data is "1" or "0", by observing the large-and-small relationship between the primitive value and reference value.

In this embodiment, a difference in signal quantity between the primitive value and reference value becomes smaller than that in the second embodiment. This is so, because of the following reason. Specifically, in the second embodiment, the spin of the reference layer 63 is inverted, thereby providing a change of "from parallel to anti-parallel" or "from anti-parallel to parallel", in order to observe a change in signal quantity. On the other hand, in the third embodiment, the spin of the reference layer 73 is not inverted, but rotated only by about 90°, thereby providing a change only of "from parallel to perpendicular" or "from anti-parallel to perpendicular", in order to observe a change in signal quantity. As a consequence, the third embodiment reduces the change in signal quantity to almost one-half that of the second embodiment. However, this level is high enough to compare the primitive value and reference value with each other so as to determine the value of the stored data.

On the other hand, according to the third embodiment, the following effects can be obtained in addition to those of the second embodiment.

Specifically, since the easy magnetization axis direction of the record layer 72 is in parallel with the write word line 56, it is possible to complete each of reading and writing on all the n-number bits belonging to one write word line 56, by one action. It is also possible to reduce the risk of causing miswriting on the record layer 72, when feeding an electric current Iref2 for reading. This is so, because, when the electric current is fed to the write word line 56, a magnetic field thus applied near the record layer 72 has an orientation directed in the hard magnetization axis direction of the record layer 72. As a consequence, even if a large electric current is fed to the write word line 56, the orientation of the spin of the record layer 72 can be hardly inverted, thus the data therein is prevented from being destroyed. Furthermore, the margin of Iref2 for reading expands, thereby suppressing miswriting or misreading in the MRAM.

In order to improve the data holding property, the record layer 72 preferably has a geometric anisotropy such that the ratio of the length in the easy magnetization axis direction relative to the length in the hard magnetization axis direction remarkably deviates from 1. In this embodiment, the record layer 72 is designed such that the ratio of the length in the easy magnetization axis direction relative to the length in the hard magnetization axis direction (Y direction length/X direction length) is 1.5 or more.

On the other hand, the ferromagnetic layer 76 of the reference layer 73 is preferably designed such that the ratio of the length in the hard magnetization axis direction relative to the length in the easy magnetization axis direction (Y direction length/X direction length) is less than 1. With this arrangement, the magnetization direction of the ferromagnetic layer 76 of the reference layer 73 can be easily rotated by about 90° by a magnetic field for reading from the write word line 56. In other words, the electric current value for forming a magnetic field for reading can be reduced. As a consequence, it is possible to reduce the power consumption in reading, and to suppress the influence on the record layers 72 of the adjacent memory cells in reading, thereby increasing the reliability of the MRAM.

From this viewpoint, in the structure shown in FIG. 8, each of the record layer 72 and reference layer 73 has an elliptic shape, while the long axis direction (easy magnetization axis direction) of the record layer 72 and the long axis direction (easy magnetization axis direction) of the reference layer 73 are perpendicular to each other.

Fourth Embodiment

Figure 9:
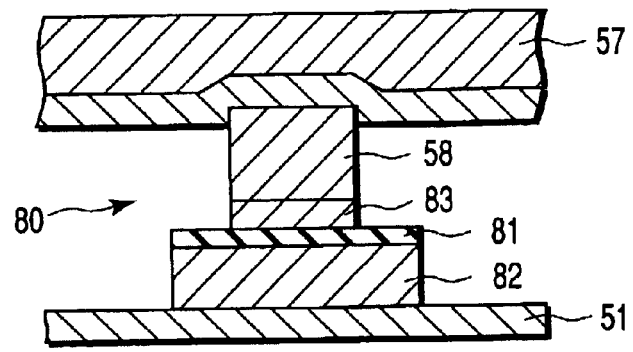
FIG. 9 is a sectional side view showing the MTJ element of each memory cell of an MRAM according to a fourth embodiment of the present invention.
Figure 10A:
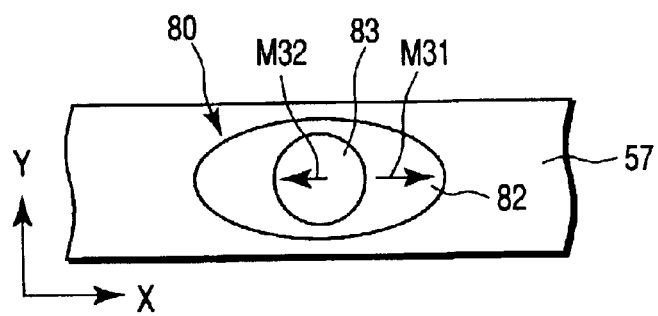
FIG. 10A is a layout plan view showing the MTJ element shown in FIG. 9.

FIGS. 9 and 10A are a sectional side view and layout plan view, respectively, showing the MTJ element of each memory cell of an MRAM according to a fourth embodiment of the present invention. The block diagram showing the entire structure of the MRAM according to this embodiment is substantially the same as that shown in FIG. 1. Also, this MRAM includes an interconnection structure and layer structure around each memory cell, substantially the same as those shown in FIGS. 2 to 4.

As shown in FIG. 9, an MTJ element 80 is sandwiched between an interconnection layer 51 and a bit line 57, i.e., it is disposed at the same position as the MTJ element 35 shown in FIG. 3. The MTJ element 80 includes a record layer 82 and reference layer 83 disposed to sandwich a tunnel barrier film (insulating film) 81. The record layer 82 is formed of a ferromagnetic layer consisting of a single-layered or multi-layered film in which at least one layer is made of a ferromagnetic alloy containing Fe, Ni, and Co. The bottom of the record layer 82 is electrically connected to the interconnection layer 51. On the other hand, the reference layer 83 is formed of a ferromagnetic layer consisting of a single-layered or multi-layered film in which at least one layer is made of a ferromagnetic alloy containing Fe, Ni, and Co. The top of the reference layer 83 is electrically connected to the bit line 57 via an interconnection 58.

The MTJ element 80 may be formed of an MTJ element including two tunnel barrier films. In this case, the MTJ element 80 has two tunnel barrier films disposed to sandwich a record layer, and two reference layers disposed one on either outside of the two tunnel barrier films. The structures of the record layer and each of the reference layers may be the same as those shown in FIG. 9, for example. Where the structure including two tunnel barrier films is adopted, it is possible to reduce a decrease in magneto resistive change rate relative to the applied voltage, and to increase the breakdown voltage.

This embodiment has a feature in that the reference layer 83 has no anti-ferromagnetic layer, but consists only of a ferromagnetic layer, unlike the reference layers 63 and 73 according to the second and third embodiments. The MTJ element 80 is designed such that retentivity of retaining the magnetization direction of the ferromagnetic layer of the reference layer 83 is smaller than retentivity of retaining the magnetization direction of the ferromagnetic layer of the record layer 82, against a magnetic field applied to the MTJ element 80 by the write word line (electric current drive line) 56 (see FIG. 3). Accordingly, it is possible to apply such a magnetic field to the MTJ element 80 by feeding an electric current with a predetermined value to the write word line 56, that can change the magnetization direction of the ferromagnetic layer of the reference layer 83 without changing the magnetization direction of the ferromagnetic layer of the record layer 82.

The retentivity of the magnetization direction of the reference layer 83 is set smaller than the retentivity of the magnetization direction of the reference layer 82 by suitably combining conditions, such as changing the material composition, decreasing the film thickness, and adopting a low aspect ratio shape. When no external magnetic field is present, the magnetization direction of the reference layer 83 is determined, depending on the magnetization direction of the record layer 82, due to the coupling between the reference layer 83 and the record layer 82. At this time, it depends on, e.g., the size of the reference layer 83, or the thickness of the tunnel barrier film 81, whether the spin (magnetization direction) of the reference layer 83 is in parallel or anti-parallel with the spin (magnetization direction) of the record layer 82.

Specifically, where the reference layer 83 is sized to be almost equal to or larger than the record layer 82, and the tunnel barrier film 81 is thin, their spins become in parallel with each other. On the other hand, where the reference layer 83 is sized to be smaller than the record layer 82, and the tunnel barrier film 81 has a certain thickness, their spins become in anti-parallel with each other. Which state is brought about is determined by the material, size, or the like of the layers. In the following explanation, for the sake of simplicity, the latter state is taken as an example, i.e., when substantially no external magnetic field is present, the spin of the reference layer 83 is in anti-parallel with the spin of the record layer 82. However, the following explanation can be also easily understood even where the latter state is replaced with the former state.

As shown in FIG. 10A, where the bit line 57 extends in an X direction, and the write word line 56 (see FIG. 3) extends in a Y direction, the long axis direction and easy magnetization axis direction of the record layer 82 are in parallel with the X direction. On the other hand, the easy magnetization axis direction of the reference layer 83 is also in parallel with the X direction, and thus it is perpendicular to the extending direction of the write word line 56 (Y direction), which is used for applying a magnetic field for reading.

According to this embodiment, the following steps are performed to read stored data in the record layer 82. The magnetization direction of the ferromagnetic layer of the reference layer 83 is determined by the coupling between the reference layer 83 and record layer 82, as described above, and can be inverted by applying a weak external magnetic field. However, in the fourth embodiment, an electric current for reading fed to the write word line 56 is intended to orient the magnetization direction of the reference layer 83 toward a specific direction. Accordingly, where the magnetization direction of the reference layer 83 is already oriented toward the specific direction in the initial state, the magnetization direction of the reference layer 83 cannot be changed by the electric current for reading. This feature differs from those of the second and third embodiments, in which the magnetization direction of the ferromagnetic layer of the reference layer is always changed by the electric current for reading.

In the explanation of a reading operation give below, it is assumed that, where the stored data is "1", the magnetization directions of the ferromagnetic layer of the record layer 82 and the ferromagnetic layer of the reference layer 83 are respectively in conditions as shown with arrows M31 and M32 in FIG. 10A, in the initial state. It is also assumed that, when an electric current Iref3 for reading is fed to the write word line 56, such a magnetic field is applied to the MTJ element 80, that orients the magnetization direction of the reference layer 83 toward the left in FIG. 10A without changing the magnetization direction of the record layer 82.

Performing reading without feeding an electric current to the write word line (to obtain a primitive value);
performing reading while feeding Iref3 to the write word line (to obtain a reference value);
comparing the primitive value and reference value with each other to determine the value of the stored data;
if the primitive value≠the reference value, the stored data is "1"; and
if the primitive value>the reference value, the stored data is "0".

Specifically, where the spin (magnetization direction) of the record layer 82 is oriented toward the right while the spin (magnetization direction) of the reference layer 83 is oriented toward the left in the initial state, feeding the electric current Iref3 for reading does not change the orientations of these two spins, thereby causing no change in the tunneling magneto resistive value. On the other hand, where the spin of the record layer 82 is oriented toward the left while the spin of the reference layer 83 is oriented toward the right in the initial state, feeding the electric current Iref3 for reading causes the spins to be in parallel with each other, thereby reducing the tunneling magneto resistive value. Accordingly, it is possible to determine whether the value of the stored data is "1" or "0", by observing the large-and-small relationship between the primitive value and reference value.

According to this embodiment, it is possible to invert only the spin (magnetization direction) of the reference layer 83 without inverting the spin (magnetization direction) of the ferromagnetic layer of the record layer 82, so as to perform nondestructive reading, in which a difference in read signal quantity almost the same as that by the conventional self-reference method can be realized. The orientation of the spin of the reference layer 83 comes back to its original state due to the coupling between the reference layer 83 and record layer 82, when the electric current fed to the write word line 56 is returned to zero. In this operation, a reading step for obtaining a reference value is performed while feeding an electric current to the write word line 56, thereby reducing the number of operation steps in the conventional self-reference method.

In order to improve the data holding property, the record layer 82 preferably has a geometric anisotropy such that the ratio of the length in the easy magnetization axis direction relative to the length in the hard magnetization axis direction remarkably deviates from 1. In this embodiment, the record layer 82 is designed such that the ratio of the length in the easy magnetization axis direction relative to the length in the hard magnetization axis direction (X direction length/Y direction length) is 1.5 or more.

On the other hand, the reference layer 83 is preferably designed such that the ratio of the length in the easy magnetization axis direction relative to the length in the hard magnetization axis direction (X direction length/Y direction length) is near 1 or less than 1. With this arrangement, the magnetization direction of the reference layer 83 can be easily inverted by a magnetic field for reading from the write word line 56. In other words, the electric current value for forming a magnetic field for reading can be reduced. As a consequence, it is possible to reduce the power consumption in reading, and to suppress the influence on the record layers 82 of the adjacent memory cells in reading, thereby increasing the reliability of the MRAM.

Figure 10B:
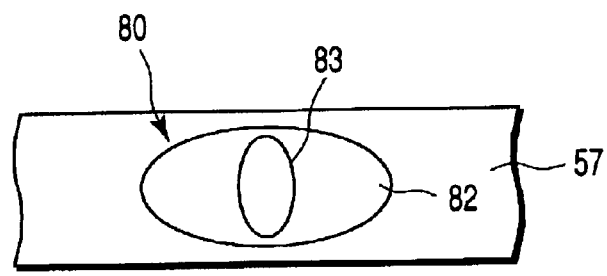
FIG. 10B is a layout plan view showing its modification.

From this viewpoint, in the structure shown in FIG. 10A, the record layer 82 has an elliptic shape having a ratio of 2, which is defined by the long axis length (length in the easy magnetization axis direction)/the short axis length (length in the hard magnetization axis direction), while the reference layer 83 has a circular shape. In a modified structure shown in FIG. 10B, each of a record layer 82 and reference layer 83 has an elliptic shape, and the long axis direction (easy magnetization axis direction) of the record layer 82 and the long axis direction (hard magnetization axis direction) of the reference layer 83 are perpendicular to each other.

In the MRAM according to this embodiment, the MTJ element 80 has no anti-ferromagnetic layer. In most cases, the anti-ferromagnetic layer contains metal atoms, such as Mn. Since Mn easily diffuses even at a low temperature, and deteriorates the properties of a tunnel barrier film, it reduces the reliability of an MRAM. For this reason, in an MRAM using a conventional MTJ element, it is necessary to limit the process temperature to about 300° in a step of forming interconnection, or of annealing the structure to improve properties of a transistor, performed after the MTJ element is formed. This limit makes it difficult to make the most of the transistor's performance.

On the other hand, in the MRAM according to this embodiment, the orientation of the spin of the reference layer 83 is determined by the coupling between the reference layer 83 and the record layer 82. The MTJ element 80 requires no anti-ferromagnetic layer for determining the orientation of the spin of the reference layer, and thus does not have to use Mn or the like. As a consequence, the limits are relaxed on heat processing steps performed after the MTJ element 80 is formed, thereby allowing a high-performance transistor corresponding thereto. It follows that the MRAM can be hybridized in a high-performance logic LSI.

According to this embodiment, a difference in read signal quantity almost the same as that by the conventional self-reference method can be realized by nondestructive reading. Accordingly, it is possible to prevent a decrease in reliability due to individual differences between memory cells, which have been caused by processing. Furthermore, the number of operation steps is reduced as compared to the conventional self-reference method, thereby allowing a high speed operation.

Fifth Embodiment

Figure 11:
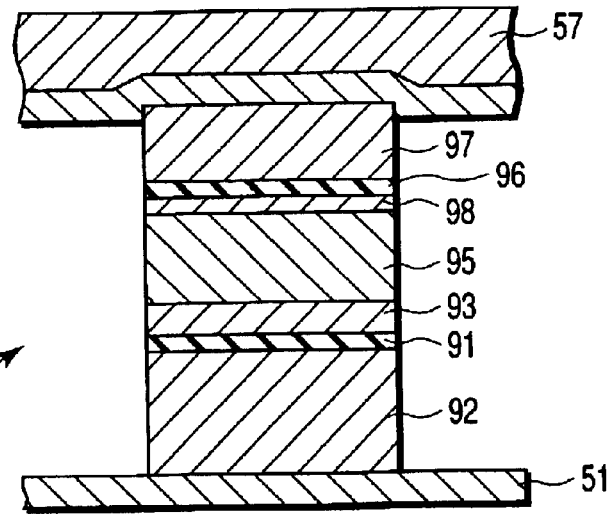
FIG. 11 is a sectional side view showing the MTJ element of each memory cell of an MRAM according to a fifth embodiment of the present invention.

FIG. 11 is a sectional side view showing the MTJ element of each memory cell of an MRAM according to a fifth embodiment of the present invention. The block diagram showing the entire structure of the MRAM according to this embodiment is substantially the same as that shown in FIG. 1. Also, this MRAM includes an interconnection structure and layer structure around each memory cell, substantially the same as those shown in FIGS. 2 to 4.

An MTJ element 90 according to this embodiment has a structure having two MTJ elements stacked one on the other, in each of which a record layer and reference layer make coupling, as explained in the fourth embodiment shown in FIG. 9. With this arrangement, a plurality of bits can be recorded in one memory cell. The MTJ element 90 is sandwiched between an interconnection layer 51 and a bit line 57, i.e., it is disposed at the same position as the MTJ element 35 shown in FIG. 3, corresponding to one memory cell.

As shown in FIG. 11, the MTJ element 90 includes a first record layer 92 and first reference layer 93 disposed to sandwich a first tunnel barrier film (insulating film) 91, and a second record layer 97 and second reference layer 98 disposed to sandwich a second tunnel barrier film (insulating film) 96. A non-magnetic layer 95 is interposed between the first reference layer 93 and second reference layer 98. The bottom of the first record layer 92 is electrically connected to the interconnection layer 51. The top of is the second record layer 97 is electrically connected to the bit line 57. Each of the record layers 92 and 97 is formed of a ferromagnetic layer consisting of a single-layered or multi-layered film in which at least one layer is made of a ferromagnetic alloy containing Fe, Ni, and Co. On the other hand, each of the reference layers 93 and 98 is formed of a ferromagnetic layer consisting of a single-layered or multi-layered film in which at least one layer is made of a ferromagnetic alloy containing Fe, Ni, and Co.

The MTJ element 90 is designed such that retentivity of retaining the magnetization direction of the first reference layer 93 is smaller than retentivity of retaining the magnetization direction of the first record layer 92; and retentivity of retaining the magnetization direction of the second reference layer 98 is smaller than retentivity of retaining the magnetization direction of the second record layer 97, both against a magnetic field applied to the MTJ element 90 by the write word line (electric current drive line) 56 (see FIG. 3). In addition, retentivity of retaining the magnetization direction of the first record layer 92 is larger than retentivity of retaining the magnetization direction of the second record layer 97. When no electric current is fed to the write word line 56, the magnetization directions of the first and second reference layers 93 and 98 are determined, depending on the magnetization directions of the first and second record layers 92 and 97, respectively.

The long axis directions and easy magnetization axis directions of the first and second record layers 92 and 97 are in parallel with the extending direction of the bit line 57. On the other hand, the easy magnetization axis directions of the first and second reference layers 93 and 98 are also in parallel with the extending direction of the bit line 57, and thus they are perpendicular to the extending direction of the write word line 56, which is used for applying a magnetic field for reading.

According to this embodiment, the following steps are performed to read stored data in the first and second record layers 92 and 97. It is assumed that the minimum values of the respective electric currents necessary for inverting the first and second reference layers 93 and 98 are Iref41 and Iref42, respectively, wherein Iref41 is larger than Iref42.

Performing reading without feeding an electric current to the write word line (to obtain primitive values);

performing reading while feeding Iref41 to the write word line (to obtain a first reference value);

performing reading while feeding Iref42 to the write word line (to obtain a second reference value);

comparing the primitive values and first reference value with each other to determine the value of the stored data in the first record layers 92; and comparing the primitive values and second reference value with each other to determine the value of the stored data in the second record layers 97.

The first and second record layers 92 and 97 may be disposed for their easy magnetization axis directions to be perpendicular to each other, so that the error write margin in writing is enlarged. In this case, for example, Iref41 is fed to the write word line 56 in reading the first record layer 92, and Iref42 is fed to the write bit line 57 in reading the second record layer 97, in order to invert the first and second reference layers 93 and 98 in reading. By doing so, it is possible to realize an MRAM, which can operate more stably.

According to this embodiment, the cell area per unit bit can be smaller, thereby realizing an MRAM with a much higher density, in addition to the effects of the fourth embodiment.

As described above, according to the first to fifth embodiments of the present invention, it is possible to provide an MRAM, which can perform reading with a small number of errors, by a reduced number of steps as compared to the reading operation of the self-reference type, and in a manner of nondestructive reading.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:

a memory cell array including memory cells respectively disposed at addresses arranged in a matrix format, each of the memory cells including a magneto resistive element as a storing element, which has a record layer and a reference layer disposed to sandwich a tunnel barrier film and is configured to store data in the record layer;

word lines respectively connected to rows of the memory cell array;

bit lines respectively connected to columns of the memory cell array;

a row decoder configured to select the word lines; and a column decoder configured to select the bit lines, wherein, when stored data in a record layer in a selected memory cell in the memory cell array is read, a value of the stored data is determined by performing a reading action while applying a magnetic field for reading to the magneto resistive element by at least one of the word line and the bit line, the magnetic field for reading being capable of changing a magnetization direction of the reference layer of the selected memory cell without destroying the stored data, and when the stored data is read, a value of the stored data is determined by performing a reading action while not applying the magnetic field for reading, to detect a primitive value of an electrical property of the selected memory cell; performing a reading action while applying the magnetic field for reading, to detect a reference value of an electrical property of the selected memory cell; and comparing the primitive value and the reference value with each other.

2. The memory according to claim 1, wherein:

the record layer comprises a first ferromagnetic layer, the reference layer comprises a second ferromagnetic layer, and a retentivity of retaining a magnetization direction of the second ferromagnetic layer is smaller than retentivity of retaining a magnetization direction of the first ferromagnetic layer, against a magnetic field applied to the magneto resistive element by an electric current drive line, which is at least one of the word lines and the bit lines.

3. The memory according to claim 2, wherein the long axis directions of the first and second ferromagnetic layers are perpendicular to each other.

4. The memory according to claim 2, wherein easy magnetization axis directions of the first and second ferromagnetic layers are perpendicular to a direction in which the electric current drive line extends.

5. The memory according to claim 2, wherein a second ratio is smaller than a first ratio, where the second ratio is a ratio of long axis length/short axis length of the second ferromagnetic layer, and the first ratio is a ratio of long axis length/short axis length of the first ferromagnetic layer.

6. The memory according to claim 2, wherein an easy magnetization axis direction of the first ferromagnetic layer is perpendicular to an easy magnetization axis directions of the second ferromagnetic layer, and is in parallel with a direction in which the electric current drive line extends.

7. The memory according to claim 2, wherein the reference layer is arranged such that the magnetization direction of the second ferromagnetic layer is oriented toward a specific direction, without depending on the magnetization direction of the first ferromagnetic layer, when no electric current is fed to the electric current drive line.

8. The memory according to claim 2, wherein the reference layer is arranged such that the magnetization direction of the second ferromagnetic layer is determined, depending on the magnetization direction of the first ferromagnetic layer, when no electric current is fed to the electric current drive line.

9. A magnetic random access memory comprising: a magneto resistive element, which has a record layer and a reference layer disposed to sandwich a tunnel barrier film and is configured to store data in the record layer; and an electric current drive line configured to selectively apply a magnetic field to the magneto resistive element, wherein the record layer comprises a first ferromagnetic layer while the reference layer comprises a second ferromagnetic layer, and retentivity of retaining a magnetization direction of the second ferromagnetic layer is smaller than retentivity of retaining a magnetization direction of the first ferromagnetic layer, against a magnetic field applied to the magneto resistive element by the electric current drive line, and wherein when stored data in the magneto resistive element is read, a value of the stored data is determined by performing a reading action while applying a magnetic field for reading to the magneto resistive element by the electric current drive line, the magnetic field for reading changing the magnetization direction of the second ferromagnetic layer without substantially changing the magnetization direction of the first ferromagnetic layer, and when the stored data is read, a value of the stored data is determined by performing a reading action while not applying the magnetic field for reading, to detect a primitive value of an electrical property of the magneto resistive element; performing a reading action while applying the magnetic field for reading, to detect a reference value of an electrical property of the magneto resistive element; and comparing the primitive value and the reference value with each other.

10. The memory according to claim 9, wherein a second electric current value is smaller than a first electric current value, where the second electric current value is a minimum value in absolute value of an electric current fed to the electric current drive line, necessary for inverting the magnetization direction of the second ferromagnetic layer, and the first electric current value is a minimum value in absolute value of an electric current fed to the electric current drive line, necessary for inverting the magnetization direction of the first ferromagnetic layer.

11. The memory according to claim 9, wherein the long axis directions of the first and second ferromagnetic layers are perpendicular to each other.

12. The memory according to claim 9, wherein easy magnetization axis directions of the first and second ferromagnetic layers are perpendicular to a direction in which the electric current drive line extends.

13. The memory according to claim 9, wherein a second ratio is smaller than a first ratio, where the second ratio stands for [long axis length]/[short axis length] of the second ferromagnetic layer, and the first ratio stands for [long axis length]/[short axis length] of the first ferromagnetic layer.

14. The memory according to claim 9, wherein an easy magnetization axis direction of the first ferromagnetic layer is perpendicular to an easy magnetization axis directions of the second ferromagnetic layer, and is in parallel with a direction in which the electric current drive line extends.

15. A magnetic random access memory comprising:

a magneto resistive element, which has a record layer and a reference layer disposed to sandwich a tunnel barrier film and is configured to store data in the record layer; and an electric current drive line configured to selectively apply a magnetic field to the magneto resistive element, wherein the record layer comprises a first ferromagnetic layer while the reference layer comprises a second ferromagnetic layer, and retentivity of retaining a magnetization direction of the second ferromagnetic layer is smaller than retentivity of retaining a magnetization direction of the first ferromagnetic layer, against a magnetic field applied to the magneto resistive element by the electric current drive line, and wherein the reference layer is arranged such that the magnetization direction of the second ferromagnetic layer is oriented toward a specific direction, without depending on the magnetization direction of the first ferromagnetic layer, when no electric current is fed to the electric current drive line, and wherein when stored data in the magneto resistive element is read, a value of the stored data is determined by performing a reading action while applying a magnetic field for reading to the magneto resistive element by the electric current drive line, the magnetic field for reading changing the magnetization direction of the second ferromagnetic layer without substantially changing the magnetization direction of the first ferromagnetic layer, and when the stored data is read, a value of the stored data is determined by performing a reading action while not applying the magnetic field for reading, to detect a primitive value of an electrical property of the magneto resistive element; performing a reading action while applying the magnetic field for reading, to detect a reference value of an electrical property of the magneto resistive element; and comparing the primitive value and the reference value with each other.

16. The memory according to claim 15, wherein a second electric current value is smaller than a first electric current value, where the second electric current value is a minimum value in absolute value of an electric current fed to the electric current drive line, necessary for inverting the magnetization direction of the second ferromagnetic layer, and the first electric current value is a minimum value in absolute value of an electric current fed to the electric current drive line, necessary for inverting the magnetization direction of the first ferromagnetic layer.

17. The memory according to claim 15, wherein the reference layer comprises a multi-layer structure including the second ferromagnetic layer and an anti-ferromagnetic layer.

18. The memory according to claim 17, wherein the reference layer further comprises a non-magnetic layer interposed between the second ferromagnetic layer and the anti-ferromagnetic layer.

19. The memory according to claim 17, wherein easy magnetization axis directions of the first and second ferromagnetic layers and a magnetization direction of the anti-ferromagnetic layer are perpendicular to a direction in which the electric current drive line extends.

20. The memory according to claim 17, wherein an easy magnetization axis direction of the second ferromagnetic layer is perpendicular to an easy magnetization axis direction of the first ferromagnetic layer, a magnetization direction of the anti-ferromagnetic layer, and a direction in which the electric current drive line extends.

21. The memory according to claim 15, wherein the long axis directions of the first and second ferromagnetic layers are perpendicular to each other.

22. The memory according to claim 15, wherein the magnetization direction of the second ferromagnetic layer is rotated substantially by 180° or 90° by the magnetic field for reading.

23. A magnetic random access memory comprising: a magneto resistive element, which has a record layer and a reference layer disposed to sandwich a tunnel barrier film and is configured to store data in the record layer; and an electric current drive line configured to selectively apply a magnetic field to the magneto resistive element, wherein the record layer comprises a first ferromagnetic layer while the reference layer comprises a second ferromagnetic layer, and retentivity of retaining a magnetization direction of the second ferromagnetic layer is smaller than retentivity of retaining a magnetization direction of the first ferromagnetic layer, against a magnetic field applied to the magneto resistive element by the electric current drive line, and wherein the reference layer is arranged such that the magnetization direction of the second ferromagnetic layer is determined, depending on the magnetization direction of the first ferromagnetic layer, when no electric current is fed to the electric current drive line, and wherein when stored data in the magneto resistive element is read, a value of the stored data is determined by performing a reading action while applying a magnetic field for reading to the magneto resistive element by the electric current drive line, the magnetic field for reading orienting the magnetization direction of the second ferromagnetic layer toward a specific direction without substantially changing the magnetization direction of the first ferromagnetic layer, and when the stored data is read, a value of the stored data is determined by performing a reading action while not applying the magnetic field for reading, to detect a primitive value of an electrical property of the magneto resistive element; performing a reading action while applying the magnetic field for reading, to detect a reference value of an electrical property of the magneto resistive element; and comparing the primitive value and the reference value with each other.

24. The memory according to claim 23, wherein a second electric current value is smaller than a first electric current value, where the second electric current value is a minimum value in absolute value of an electric current fed to the electric current drive line, necessary for inverting the magnetization direction of the second ferromagnetic layer, and the first electric current value is a minimum value in absolute value of an electric current fed to the electric current drive line, necessary for inverting the magnetization direction of the first ferromagnetic layer.

25. The memory according to claim 23, wherein the reference layer is arranged such that the magnetization direction of the second ferromagnetic layer is in parallel with the magnetization direction of the first ferromagnetic layer, when no electric current is fed to the electric current drive line.

26. The memory according to claim 23, wherein the reference layer is arranged such that the magnetization direction of the second ferromagnetic layer is in anti parallel with the magnetization direction of the first ferromagnetic layer, when no electric current is fed to the electric current drive line.

27. The memory according to claim 23, wherein the reference layer includes no anti-ferromagnetic layer.

28. The memory according to claim 23, wherein easy magnetization axis directions of the first and second ferromagnetic layers are perpendicular to a direction in which the electric current drive line extends.

29. The memory according to claim 23, wherein a second ratio is smaller than a first ratio, where the second ratio stands for [long axis length]/[short axis length] of the second ferromagnetic layer, and the first ratio stands for [long axis length]/[short axis length] of the first ferromagnetic layer.

30. The memory according to claim 23, wherein the long axis directions of the first and second ferromagnetic layers are perpendicular to each other.

31. A magnetic random access memory comprising: a magneto resistive element, which has a first record layer and a first reference layer disposed to sandwich a first tunnel barrier film, and a second record layer and a second reference layer disposed to sandwich a second tunnel barrier film, and is configured to store data in the first and second record layers; and an electric current drive line configured to selectively apply a magnetic field to the magneto resistive element, wherein the first and second record layers respectively comprise first and third ferromagnetic layers while the first and second reference layers respectively comprise second and fourth ferromagnetic layers, and retentivity of retaining a magnetization direction of the second ferromagnetic layer is smaller than retentivity of retaining a magnetization direction of the first ferromagnetic layer, and retentivity of retaining a magnetization direction of the fourth ferromagnetic layer is smaller than retentivity of retaining a magnetization direction of the third ferromagnetic layer, against a magnetic field applied to the magneto resistive element by the electric current drive line, and wherein the first and second reference layers are arranged such that the magnetization directions of the second and fourth ferromagnetic layers are determined, respectively depending on the magnetization directions of the first and third ferromagnetic layers, when no electric current is fed to the electric current drive line.

* * * * *